US009181088B2

(12) United States Patent
Sibuet et al.

(10) Patent No.: US 9,181,088 B2
(45) Date of Patent: Nov. 10, 2015

(54) OBJECTS ASSEMBLY THROUGH A SEALING BEAD INCLUDING INTERMETALLIC COMPOUNDS

(75) Inventors: Henri Sibuet, La Buisse (FR); Xavier Baillin, Crolles (FR); Nicolas Sillon, Saint Egreve (FR)

(73) Assignee: Commissariat a l'energie atomique et aux energies alternatives, Paris (FR)

(\*) Notice: Subject to any disclaimer, the term of this patent is extended or adjusted under 35 U.S.C. 154(b) by 926 days.

(21) Appl. No.: 13/218,763

(22) Filed: Aug. 26, 2011

(65) Prior Publication Data

US 2012/0052313 A1     Mar. 1, 2012

(30) Foreign Application Priority Data

Aug. 31, 2010    (FR) ...................................... 10 56883

(51) Int. Cl.
*B32B 15/01*     (2006.01)
*B81C 3/00*     (2006.01)
*H01L 23/10*     (2006.01)

(52) U.S. Cl.
CPC ............... *B81C 3/001* (2013.01); *H01L 23/10* (2013.01); *B81C 2203/0109* (2013.01); *B81C 2203/035* (2013.01); *H01L 2224/8181* (2013.01); *H01L 2924/01322* (2013.01); *H01L 2924/01327* (2013.01); *H01L 2924/1461* (2013.01); *Y10T 428/31678* (2015.04)

(58) Field of Classification Search
None
See application file for complete search history.

(56) References Cited

U.S. PATENT DOCUMENTS

| 7,771,547 | B2 * | 8/2010 | Bieler et al. | 148/538 |
| 7,786,588 | B2 * | 8/2010 | Danovitch et al. | 257/772 |
| 8,299,616 | B2 * | 10/2012 | Chuang et al. | 257/758 |
| 2004/0112478 | A1 | 6/2004 | Bieler et al. | |
| 2006/0055032 | A1 * | 3/2006 | Chang et al. | 257/734 |

FOREIGN PATENT DOCUMENTS

| WO | WO 96/19314 | 6/1996 |
| WO | WO 01/86715 A2 | 11/2001 |

OTHER PUBLICATIONS

Preliminary Search Report issued May 20, 2011 in French Application No. 1056883 (With English Translation of Category of Cited Documents).
Search Report issued Oct. 6, 2011 in European Application No. 11178878.2 (With English Translation of Category of Cited Documents).
Warren C. Welch III, et al., "Gold-Indium Transient Liquid Phase (TLP) Wafer Bonding for MEMS Vaccum Packaging", IEEE 21st International Conference on Micro Electro Mechanical Systems, Jan. 2008, pp. 806-809.

\* cited by examiner

*Primary Examiner* — Mark Ruthkosky
*Assistant Examiner* — Daniel J Schleis
(74) *Attorney, Agent, or Firm* — Oblon, McClelland, Maier & Neustadt, L.L.P.

(57) ABSTRACT

An assembly of two objects integral with each other through at least one linking element provided between both objects, said linking element including at least a first material portion comprising intermetallic compounds of a phase formed with a first brazing metal and a second metal the melting point of which is higher than that of the first brazing metal, said linking element further including at least a second material portion composed of at least a third metal, said second material portion contacting both objects.

14 Claims, 4 Drawing Sheets

FIG. 10

OBJECTS ASSEMBLY THROUGH A SEALING BEAD INCLUDING INTERMETALLIC COMPOUNDS

TECHNICAL FIELD

The present invention relates to the field of assembling objects, in particular for microelectronics. The invention is in particular applicable for packaging, or encapsulating microsystems, or microcomponents, of the MEMS (microelectromechanical systems), NEMS (nanoelectromechanical systems) or even MOEMS (microoptoelectromechanical systems) type, into hermetic cavities formed between a support and a cap.

STATE OF PRIOR ART

A packaging of a microsystem enables this microsystem to be protected from external attacks in view of the small dimensions thereof, to be securely handled when integrated into an electronic device, or to be encapsulated under a controlled atmosphere. Such a packaging includes an assembling operation between a support on which the microsystem is made beforehand, and a cap, encapsulating the microsystem in a cavity formed between the support and the cap. For cost reasons, such assembling is generally carried out collectively for several microsystems made on the support. The support is generally a substrate, that is a semi-conductor wafer with a diameter that can be up to about 300 mm. The cap may also be formed with a second substrate.

The thus obtained chips (a chip corresponding to a microsystem encapsulated in its cavity) are then separated from one another by an operation of cutting the support (and possibly the cap if it is common to several chips). Such an assembly of the cap to the support should therefore be mechanically robust and, when the microsystem is encapsulated under a controlled atmosphere, be hermetic in order to avoid any gas exchange with the outside of the cavity.

This assembly between the support and the cap is for example made though a metal sealing bead which provides cohesion and mechanical holding between the support and the cap, while forming the side walls of the cavity. The metal bead is generally made from a brazing metal, for example tin or a tin-based alloy.

However, using such a metal bead has the drawback window that after making the assembly between the support and the cap through the metal bead, it is not possible to implement technological steps involving thermal budgets higher than the melting temperature, or melting point, of the brazing metal in which case the metal bead would be melted again and therefore the previously made packaging would be destroyed.

To remedy this drawback, it is possible to make the assembly between the support and the cap by implementing an isothermal solidification brazing method, also called TLPB ("Transient Liquid Phase Bonding"). This type of brazing or soldering consists in melting the brazing metal, which may be a pure metal or an alloy, contacting another metal the melting point, or melting temperature of which is higher than that of the brazing metal and which reacts with the brazing metal in a liquid phase so as to change the chemical composition thereof. This chemical reaction forms intermetallic compounds (IMC) which result in the entire consumption of the melted brazing metal. Thus, the whole brazing metal is chemically transformed into IMC which forms the braze or solder. These IMCs have a chemical composition corresponding to the combination of the brazing metal and the metal of higher melting point, and include a different crystallographic structure from the crystallographic structures of the brazing metal and the metal of higher melting point.

By way of example, it is possible to use tin (brazing metal) that is melted between two nickel layers (metal of higher melting point), these layers being made according to a pattern corresponding to that of the sealing bead to be made. One of both nickel layers is made beforehand on a face of the support and the other of both nickel layers is made beforehand on a face of the cap, these faces being intended to face each other once the assembly is terminated. During brazing, tin reacts with nickel to form IMCs of a (Sn, Ni) phase the crystallographic structure of which is different from those of tin and nickel, and the melting temperature of which is higher than that of tin which is about 232° C. Thus, there is obtained a metal sealing bead formed by the superimposition of at least three metal layers, that is at least one layer of intermetallic (Sn, Ni) phase provided between two nickel layers, these layers being parallel to the support and the cap.

However, even though these IMCs enable the melting point of the sealing bead made to be increased and in view of the fact that they are provided in layers parallel to the substrate, or to the support, and bounded to each other, thus defining interfaces between potentially brittle IMCs, they mechanically embrittle the sealing bead. This can therefore cause problems in particular in the case of encapsulating a microsystem which requires a good mechanical strength of the assembly made.

DESCRIPTION OF THE INVENTION

Thus there is a need to provide a new type of assembly of two objects having the advantage provided by the intermetallic compounds, that is increasing the melting point of the linking element between both objects, while avoiding a mechanical embrittlement of the assembly.

For this, it is proposed an assembly of two objects integral with each other through at least one linking element provided between both objects, said linking element including at least a first material portion comprising intermetallic compounds of a phase formed with a first brazing metal and a second metal the melting point of which is higher than that of the first brazing metal, said linking element further including at least a second material portion composed of at least a third metal, said second material portion contacting both objects.

It is thus provided an assembly of two objects by a linking element comprising IMCs, these IMCs enabling the melting point of the linking element to be increased with respect to the melting point of the brazing or soldering metal used to form these IMCs. Moreover, thanks to the second material portion composed of the third metal, which may not include IMCs or include IMCs different from those of the first portion of the linking element and that may be chosen so that they provide better properties in terms of mechanical resistance, and which contacts both objects (this contact being direct between both objects, that is a contact made not via the IMC of the first portion of the linking element), the IMCs present in the first material portion(s) of the linking element do not mechanically embrittle the linking element in view of the mechanical connection formed by this second material portion between both objects. Thus, with respect to a linking element made as layers superimposed and parallel to the objects, the structure of the linking element enables a greater mechanical resistance to be obtained.

It is possible that the third metal be an alloy of the second metal and of one of the components of the brazing alloy (case of a brazing alloy with a eutectic composition).

Such an assembly provides mechanical strength enabling for example to carry out on the assembly one or more mechanical grinding operations in particular in order to reduce the thickness of at least one of both objects and/or a subsequent cutting of the objects.

Moreover, when the linking element is hermetic, the tightness of the assembly enables the assembly to undergo wet technological operations.

By "intermetallic compounds", or IMC, it is meant compounds the chemical composition of which corresponds to the combination of at least two different metal elements, and including a crystallographic structure different from the crystallographic structures of each of the metal elements.

In a first embodiment, the assembly may include at least two first material portions comprising the intermetallic compounds, both first material portions contacting both objects, the second material portion being provided between both first material portions.

In this case, the assembly may further include at least two metal walls composed of the second metal and contacting at least one of both objects, each of both first material portions being provided between the second material portion and one of both metal walls. Both metal walls, which have a geometry which may be defined as a function of the desired geometry of the first material portions within the linking element, may thus control the three-dimensional structure of the linking element made and in particular the geometry and distribution of the first material portions, that is the IMCs, in the linking element. Both metal walls may be made such that the first material portions including the IMCs form "layers" perpendicular to the integral faces of the objects. Thus, the first material portions including the IMCs do not affect the mechanical strength of the linking element. This control also enables to control the final dimensions of the linking element, as well as nature of the interfaces (between the second material portion and the objects) which shall provide mechanical strength to the assembly.

Both metal walls may be contacting both objects. Thus, these two metal walls may also act as thickness wedges between both objects in order to ensure the gap between both objects, and thus the thickness of the linking element made.

In a second and a third embodiment, the assembly may include one or more first material portions comprising the intermetallic compounds, which first material portions may contact one of both objects and be covered with the second material portion.

In this case, the assembly may further include one or more metal portions, or metal pads, composed of the second metal and contacting one of both objects, each of the metal pads being at least partially covered with one of the first material portions. Again, the metal pads or portions, which may have a geometry defined as a function of the desired geometry of the first material portions within the linking element, may thus control the three-dimensional structure of the linking element and in particular the geometry and distribution of the IMCs in the linking element. The metal pads may be made such that the first material portions including the IMCs form discontinuous pads against at least one of both objects along the linking element. Thus, the material portions including the IMCs do not affect the mechanical strength of the linking element. This control also enables to control the final dimensions of the linking element as well as the nature of interfaces which would ensure the mechanical strength of the assembly. It is also possible to make these pads continuously along the linking element.

The first brazing material may include tin and/or the second metal may include nickel or copper, and/or the third metal may include gold. It is thus possible to make the linking element from an Au—Sn-type eutectic, for example of the Au—Sn 29% at. type (that is an alloy formed with 29% atomic tin and 71% atomic gold), which has a melting point compatible with microsystem encapsulation. Moreover, such a eutectic has also the advantage of not requiring a stripping or deoxidation before brazing unlike other brazing metals or eutectics melting at low temperatures (and thus compatible for encapsulating microsystems) which are generally sensitive to oxidation. In one alternative, it is possible to use the eutectic Au—Si 19% at.

The second metal including copper or nickel enables the melting point of the linking element to be increased by forming IMCs from the chemical reaction with tin. Furthermore, copper and nickel also have the advantage of being able to be deposited electrolytically or through PVD (physical vapour deposition).

Advantageously, the third metal is different from the first brazing metal. However, this is applicable to an assembly wherein the third metal is of the same nature as the first brazing metal.

Both objects may be a substrate and a cap, the assembly being able to further include at least a microsystem integral with a substrate and encapsulated in a cavity formed between the substrate and the cap, the linking element being a sealing bead forming hermetic side walls of the cavity. Such an assembly enables in particular the microsystem to be encapsulated under a controlled atmosphere.

It is also proposed a method for assembling two objects, including at least the steps of:
  making a brazing element formed with at least a first brazing metal and a third metal on one of both objects,
  contacting the brazing element with at least a second metal the melting point of which is higher than that of the first brazing metal,
  brazing both objects by isothermal solidifying the brazing element, forming at least one linking element provided between both objects, said linking element including at least a first material portion comprising intermetallic compounds of a phase formed with the first brazing metal and the second metal, and at least a second material portion composed of the third metal, said second material portion contacting both objects.
Implementing such a method thus enables to ensure:
  control of the localised solidification of metals used for brazing, or soldering, in particular around microsystems when the assembling method encapsulates microsystems, and
  control of the space formed between both assembled objects.

According to the first embodiment, the assembling method may further include, before the step of contacting the brazing element with the second metal, a step of making at least two metal walls composed of the second metal contacting with at least one of both objects, and wherein:
  during the step of contacting the brazing element with the second metal, the brazing element may be provided between said two metal walls, and
  the brazing step may form at least two first material portions comprising the intermetallic compounds, which two first material portions may contact both objects, the second material portion being able to be provided between the two first material portions, and each of the two first material portions being able to be provided between the second material portion and one of both metal walls.

According to the second embodiment, the assembling method may further include, before the step of making the brazing element, a step of making one or more metal pads composed of the second metal contacting said one of both objects, which brazing element may be made such that it at least partially covers the metal pads, and wherein the brazing step may form one or more first material portions comprising the intermetallic compounds, the first material portions at least partially covering the metal pads and being able to be covered with the second material portion.

According to the third embodiment, the assembling method may further include, before the step of making the brazing element, a step of making one or more metal pads composed of the second metal contacting with one of both objects, the brazing element being able to be made on the other of both objects, and wherein:

during the step of contacting the brazing element with the second metal, the brazing element may be provided against the metal pads, and the brazing step may form one or more first material portions comprising the intermetallic compounds, the first material portions being able to at least partially cover the metal pads and being able to be covered with the second material portion.

Making the brazing element may include implementing the following steps of:

depositing the third metal on one of both objects, depositing the first brazing metal on the third metal, heat treating the first brazing metal and the third metal, forming through solid state diffusion the brazing element which may be composed of a eutectic composed of the first brazing metal and the third metal.

Both objects may be a substrate and a cap, at least one microsystem being able to integral with the substrate, the brazing element being able to be made as a bead such that the brazing step forms a sealing bead mechanically connecting the cap with the substrate and forming hermetic side walls of a cavity formed between the substrate and the cap and wherein the microsystem may be encapsulated.

The embodiment is particularly applicable to an assembly encapsulating a microsystem into a cavity formed between a support and a cap, for example under vacuum or under a controlled atmosphere. This is also applicable to an assembly of pieces, for example metallic or metal and ceramics based ones, by forming a controlled thickness wedge between both objects, with an intermetallic localisation such as defined above, in particular for aeronautics or aerospace applications.

BRIEF DESCRIPTION OF THE DRAWINGS

The present invention will be better understood upon reading the description of exemplary embodiments given only for illustrating only and in no way limiting purposes, by referring to the appended drawings wherein.

Identical, similar or equivalent parts of different figures described hereafter are given the same numerals so as to make it easier passing from one figure to another.

Different parts represented in the figures are not necessarily drawn at a consistent scale, in order to make the figures more visible.

The different possibilities (alternatives and embodiments) should be understood as not being exclusive from one another and may be combined between one another.

DETAILED DESCRIPTION OF PARTICULAR EMBODIMENTS

Figure 1:
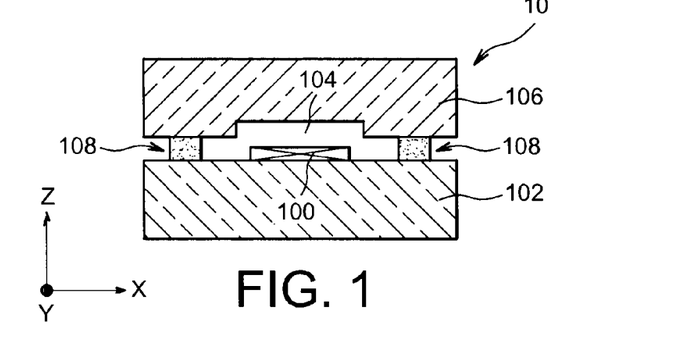
FIG. 1 represents a cross-section view of an assembly of two objects according to one embodiment.

An assembly 10 of two objects 102 and 106, here encapsulating a microsystem 100, for example a MEMS, NEMS or MOEMS device, into a cavity 104 formed between a substrate 102 on which is made the microsystem 100 and a cap 106 is represented in FIG. 1. The substrate 102 and the cap 106 are composed of one or more materials enabling them to be integral with each other by a brazing or soldering process. Thus, the substrate 102 is composed of a semi-conductor such as silicon, while the cap 106 is formed by a second substrate also composed of a semi-conductor such as silicon. The cavity 104 is laterally bounded by a sealing bead 108 forming a linking element ensuring that the cap 106 is integral with the substrate 102. The material of the sealing bead 108 also ensures hermetic encapsulation of the microsystem 100. Thus, the microsystem 100 can be encapsulated in a particular gas atmosphere or under vacuum.

Figure 2:
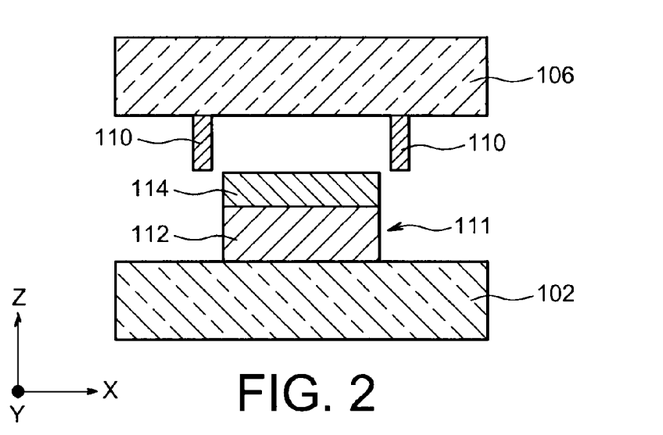
FIGS. 2 to 4 represent steps of an assembling method according to a first embodiment.
Figure 3:
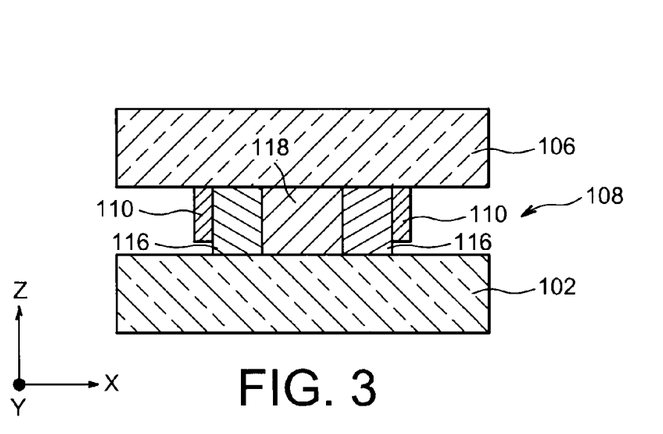
Figure 4:
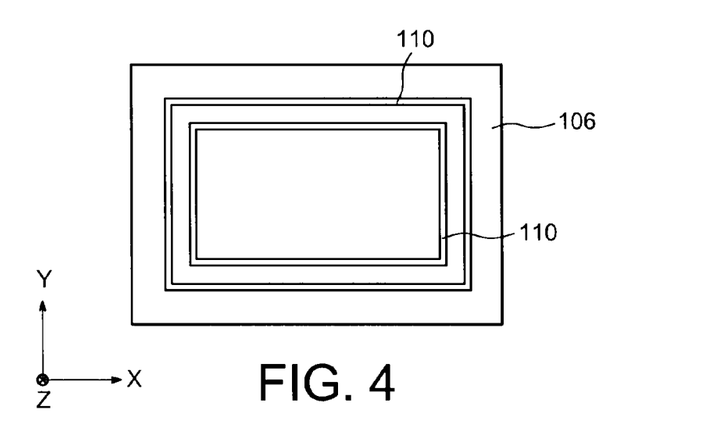

Let us refer to FIGS. 2 to 4 which illustrate steps of a method for assembling the cap 106 to the substrate 102, forming the assembly 100, according to a first embodiment.

To make such an assembly 10, first, as represented in FIG. 2, there are formed on a face of the cap 106 intended to be provided facing the substrate 102, metal portions 110, forming metal walls, intended to laterally continuously bound, that is all around the cavity 104, the sealing bead 108, and to form intermetallic compounds within the sealing bead 108. Theses metal walls 110 are for example composed of nickel so that afterwards, a eutectic in particular composed of a brazing or soldering metal and contacting these walls 110 forms, by implementing an isothermal solidification brazing process, intermetallic compounds (IMC) of a phase formed with nickel and the brazing metal. It is also possible that the metal walls 110 be composed of copper.

The thickness of the metal walls 110 (dimension along the axis Z represented in FIG. 2), that is the dimension perpendicular to the planes of the main faces of the substrate 102 (the microsystem 100 being provided on one of these main faces) and of the cap 106 of the metal walls 110, is here lower than the height of the sealing bead 108 to be made, and for example between about 1 µm and 4 µm. FIG. 4 represents a bottom view of the cap 106 at which the walls 110 are made. The pattern formed by the metal portions in the plane (Y, Y) corresponds to the desired pattern of the sealing bead 108.

In parallel with making the metal walls 110, a brazing or soldering element 111 is formed on the substrate 102 as a bead. This brazing bead 111 here consists of a first layer 114 composed of a brazing or soldering metal, for example tin, provided on a second layer 112 composed of another metal, for example gold.

An exemplary embodiment of the brazing bead 111 will be described below. First, a thermal oxidation is carried out on the face of the substrate 102 on which the brazing bead 111 is intended to be made, forming a thin oxide layer, with a thickness for example between a few tens of nanometers and a few hundreds of nanometers, at this face of the substrate 102. Then, on this oxide layer, a PVD deposition of a tie layer is carried out, for example composed of titanium, and then of a barrier layer, for example composed of tungsten nitride or titanium and with a thickness equal to about a few tens of nanometers or for example between about 10 nm and 100 nm. The material of the barrier layer is selected so that it is little or not reactive with the brazing metal 114 and the other metal 112, that is such that it does not chemically react upon brazing with the metals 112 and 114 for the IMC formation to be avoided. An electrolysis layer, composed of said other metal (herein gold) is then deposited through PVD on the barrier layer, advantageously in the same PVD deposition equipment as that used to deposit the barrier layer. The thickness of the electrolysis layer is for example equal to about 100 nm.

Then, on the previously deposited electrolysis layer, a mask is made the pattern (in the plane (X, Y) represented in FIG. 2) of which associated with that of the metal walls 110 corresponds to that of the desired brazing bead 111 to be made. A photolithography of the electrolysis layer is then made through this mask.

Then, a first gold electrolytic deposition is made, forming the second layer 112 which has for example a thickness of about 3 μm, and then a second tin electrolytic deposition, forming the first layer 114 which has for example a thickness of about 2 μm. The thicknesses of the layers 112 and 114 are selected as a function of the desired thickness of the brazing bead 111, which will substantially correspond to the sum of the thicknesses of the layers 112 and 114 (herein equal to about 5 μm), and as a function of the desired composition of the brazing bead 111. The mask as well as the portions of the electrolysis layer, the barrier layer, the tie layer and the oxide layer that are not located under the metal layers 112 and 114 are then removed, for example through etching.

Then, a thermal treatment under vacuum is carried out on the substrate 102 in order for the metals of the brazing bead 111 to form, through solid state diffusion between both layers 112 and 114, a eutectic Au/Sn. In the present case, since the thicknesses of the layers 112 and 114 have a ratio of about 1.5, a eutectic of the type Au—Sn 29% at. is therefore obtained.

The metal walls 110 are made on the cap 106 by electrolytic deposition or PVD deposition. The steps implemented to make the metal walls 110 may be substantially similar to those forming the brazing bead 111 (thermal oxidation of the cap 106, depositions of a tie layer, a barrier layer and an electrolysis layer, making a mask, photolithography, nickel electrolytic deposition, and removing the mask and portions of the previously made layers that are not located under the metal walls 110). The width (dimension along the axis X) of the metal walls 110 is selected so that the volume of these metal walls 110 is between about 5% and 20% of the volume of the brazing bead 111.

Then, an isothermal solidification is implemented for making the cap 106 integral with the substrate 102 and for encapsulating the microsystem 100 in the cavity 104. For this, the brazing bead 111 is contacted with the cap 106 such that this bead 111 is provided between both metal walls 110. During the brazing or soldering carried out thereafter, the eutectic of the bead 111 melts while contacting the metal walls 110, thus forming, against the metal walls 110, material portions 116 including IMCs. These IMCs are composed of a phase (Ni, Sn) from the reaction of tin of the bead 111 with nickel of the metal walls 110. Between these first material portions 116, a second material portion 118, composed of the remaining material of the eutectic which has not reacted with the metal walls 110, is formed between the first portions 116 (see FIG. 3). This second material portion 118 is here formed with a phase (Au, Sn) with a high gold content since tin from the eutectic of the bead 111 is totally or mostly consumed for the formation of the first portions 116 comprising the IMCs. Gold and nickel define a solid solution on the whole binary phase diagram which regards them. In the phases (Ni, Sn), nickel could be substituted for gold and vice versa for the phases (Au, Sn).

Thus, upon brazing, the metal walls 110 control the structure resulting from solidification (sealing bead 108), and in particular the geometry and distribution of the IMCs 116 within the sealing bead 108. In this first embodiment, the metal walls 110 form vertical walls against which the IMCs 116 precipitate as layers perpendicular to the substrate 102 and the cap 106. A part of the sealing bead 108 other than the IMCs, that is the second material portion 118, provides for a strong mechanical link between the substrate 102 and the cap 106. Thus, the presence of IMCs within the sealing bead 108 does not affect the mechanical strength between the substrate 102 and the cap 106 obtained by the sealing bead 108.

In one alternative of the first embodiment previously described, it is possible to make the metal walls 110 such that the thickness thereof is substantially equal to the desired thickness of the sealing bead 108. Thus, the metal walls 110 may act as thickness wedges between the cap 106 and the substrate 102, and thus ensure the thickness of the sealing bead 108 made.

In the embodiment described herein, and as shown in FIG. 4, the metal walls 110 are continuously made along the pattern of the sealing bead 108. In one alternative, it is possible for the metal walls 110 to be made as discontinuous portions.

Figure 5:
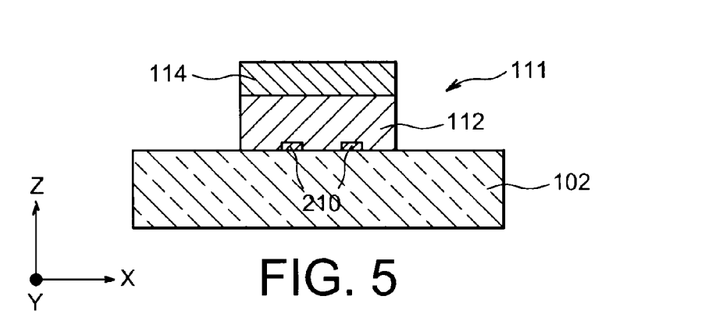
FIGS. 5 to 7 represent steps of an assembling method according to a second embodiment.
Figure 6:
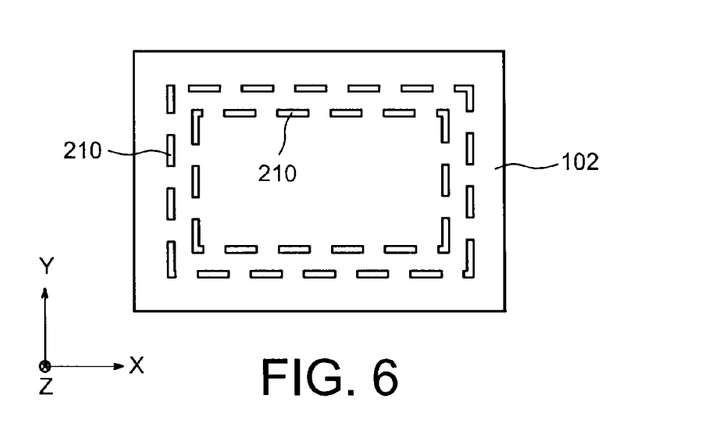
Figure 7:
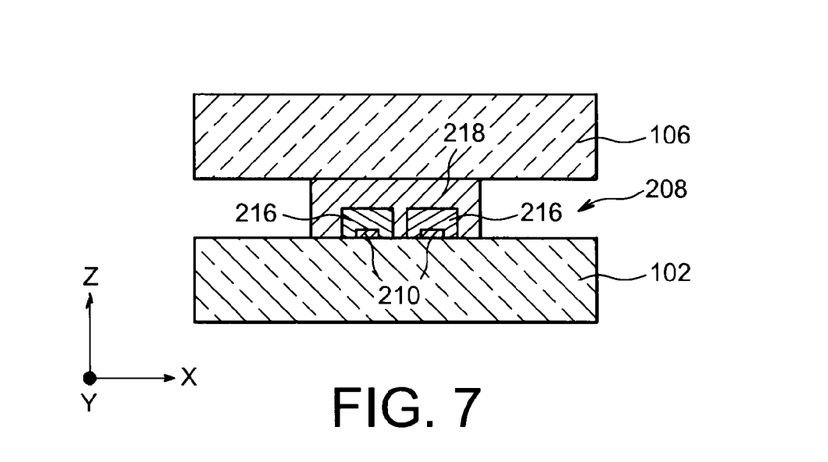

Let us now turn to FIGS. 5 to 7, which illustrate the steps of a method for assembling the cap 106 to the substrate 102 through a sealing bead 208, forming the assembly 10 according to a second embodiment. In this second embodiment, this assembly 10 enables to encapsulate the microsystem 100 into the cavity 104 formed between the substrate 102 and the cap 106 and laterally bounded by the sealing bead 208.

Contrary to the first embodiment, the metal portions intended to chemically react with the brazing metal to form IMCs are not made as vertical continuous portions against the cap 106, that is metal walls. In this second embodiment, prior to making the brazing bead 111, a plurality of metal portions 210 are made, as metal pads, on the face of the substrate 102 intended to face the cap 106, as discontinuous portions. The pattern formed by these metal pads 210 corresponds to the pattern of the sealing bead 208 desired to be made (see FIG. 6 corresponding to a top view of the substrate 102 on which the metal pads 210 are made). The thickness (dimension along the axis Z represented in FIG. 5) of the metal pads 210 may be of a few hundreds of nanometers, or for example between about 100 nm and 1 μm. The steps implemented to make these metal pads 210 may be substantially similar to those implemented to make the metal walls 110, except that the discontinuous pattern of the pads 210 is defined beforehand by photolithography and etching through a mask in the electrolysis layer initially deposited through PVD on the barrier layer.

The metal layers 112 and 114 forming the brazing bead 111 are then deposited on the substrate 102 similarly to the first embodiment, except that the brazing bead 111 covers the metal pads 210. Once again, the steps implemented to make this brazing bead 111 may be substantially similar to those implemented in the first embodiment (deposition of different layers, photolithography to dimension the bead 111, electrolytic deposition of the layers 112 and 114, removing the different elements previously made that are not located under the layers 112 and 114, heat treatment forming the eutectic composed of the metals of the layers 112 and 114).

The sealing bead 208 is then formed by contacting the cap 106 with the brazing bead 111 and by brazing or soldering through isothermal solidification in order for the melted eutectic of the bead 111, and more particularly the elements from the brazing metal, to chemically react with the metal of the metal pads 210, forming material portions 216 including IMCs, these portions covering the metal pads 210. The metal pads 210 also act as a barrier to the flow of melted metal from the bead 111. The remaining metal that has not reacted with the metal pads 210 forms a second material portion 218 covering the material portion 216 as well as a part of the substrate 102 that is located close to the material portions 216 in order to ensure a strong mechanical hold between the substrate 102 and the cap 106. The sealing bead 208 obtained may be considered as including mechanical anchorages formed by the material portions 216 comprising the IMCs, strengthened by a metal matrix with a high gold content formed by the second material portion 218.

Figure 8:
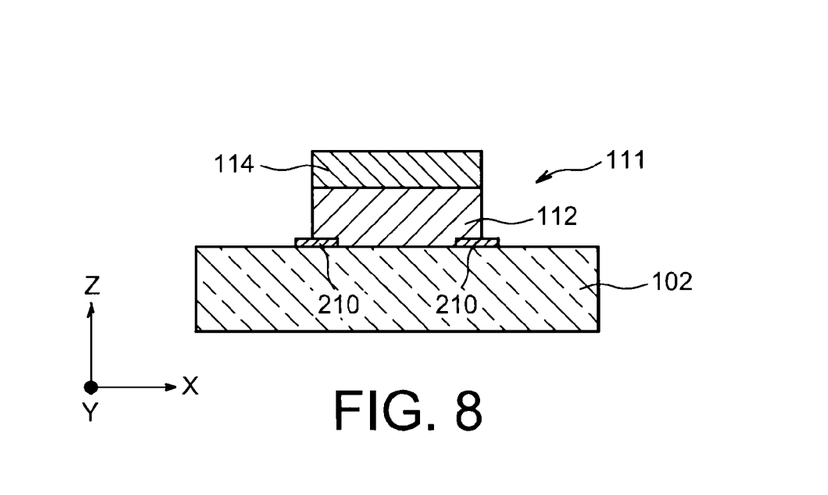
FIG. 8 represents a step of an assembling method according to one alternative of the second embodiment.

In a first alternative of this second embodiment, it is possible for the metal pads 210 and the brazing bead 111 to be made such that this brazing bead 111 only partially covers the metal pads 210 (see FIG. 8). Thus, there is obtained a sealing bead including material portions of IMC formed at the periphery of the sealing bead. In this case, the isothermal solidification will begin directly below the metal pads 210, thus limiting the braze or solder flow. Moreover, the mechanical connection between the substrate and the cap is in this case mainly ensured by the second metal portion, that is for example enriched with gold.

In a second alternative of this second embodiment, the metal pads 210 may be continuous, that is uninterrupted, along the entire bead formed. The pattern thus formed by the metal portions 210 substantially corresponds to the pattern represented in FIG. 4.

Figure 9:
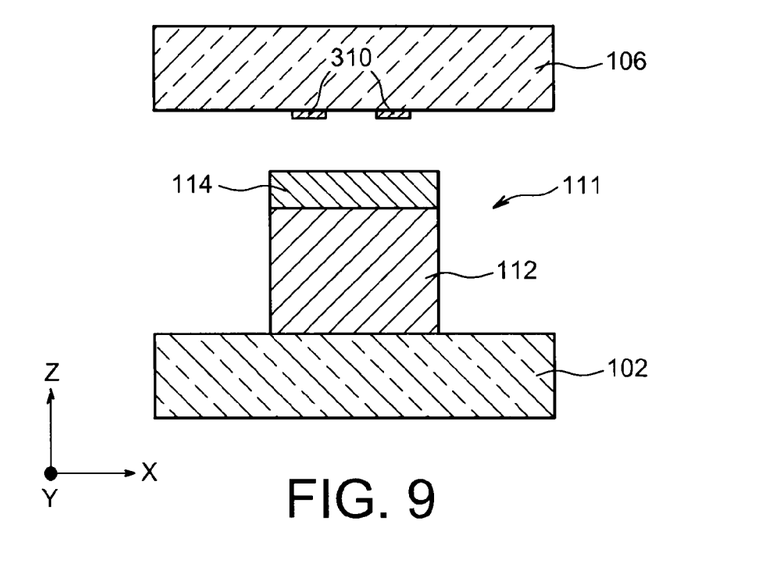
FIGS. 9 and 10 represent steps of an assembling method according to a third embodiment.
Figure 10:
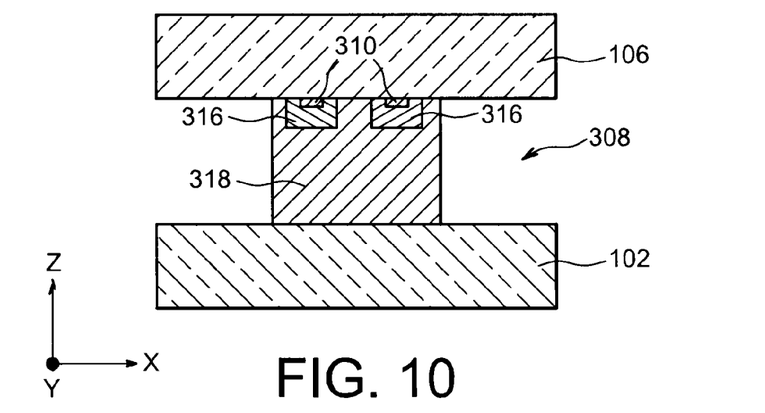

Let us now refer to FIGS. 9 and 10 to describe a method for assembling the cap 106 to the substrate 102 through a sealing bead 308 according to a third embodiment.

With respect to the assembly according to the second embodiment previously described in connection with FIGS. 5 to 7, metal portions 310, forming metal pads, are made against the cap 106 and not against the substrate 102. The pattern, dimensions and nature of the metal pads 310 are for example similar to those of the metal pads 210. The brazing bead 111 is made against the substrate 102 similarly to the first embodiment.

The assembly is then made by contacting the bead 111 with the metal pads 310 and then by implementing an isothermal solidification brazing, forming material portions 316 including IMCs and covering the metal pads 310, substantially analogously to the material portions 216 previously described. The remaining metal of the bead 111 which has not reacted with the metal pads 310 forms a second material portion 318 surrounding the material portions 316 and which, because of the contact with the cap 106, close to the material portions 316, and the substrate 102, ensures a strong mechanical hold between the substrate 102 and the cap 106. Thus, any diffusing reaction between the metals of the pads 310 and the bead 111 is avoided during the heat treatment of homogenization of the brazing metal when this is a eutectic alloy.

The alternatives of the second embodiment previously described, wherein the brazing bead only partially covers the metal portions and/or the metal portions are continuous, are also applicable to the third embodiment described above.

The assemblies previously described according to the different embodiments are advantageously implemented for collectively encapsulating several microsystems into several distinct cavities formed between the cap and the support. Advantageously, one or more sealing beads will be made, for example similar to one of the sealing beads 108, 208 or 308, at the periphery of substrates forming the support and the cap, in order to ensure tightness between these substrates, between the cavities, but also to reinforce the mechanical strength of the assembly of both substrates. It is thus possible to implement post-assembling technological steps such as thinning and polishing one of both substrates, followed by example by cutting the substrates or other conventional steps of microelectronics.

The invention claimed is:

1. An assembly, comprising:
   a first object,
   a second object,
   at least one linking element between faces of the first object and the second object so that the first and second objects are integral with each other, and
   a microsystem,
   wherein
   one of the first and second objects is a substrate and the other is a cap,
   the microsystem is integral with the substrate and encapsulated in a cavity formed between the substrate and the cap,
   the linking element is a sealing bead forming hermetic side walls of the cavity and comprises
      at least a first material portion comprising intermetallic compounds of a phase formed with a first brazing metal and a second metal the melting point of which is higher than that of the first brazing metal, and
      at least a second material portion composed of at least a third metal which is a metal different from the first brazing metal and the second metal,
   the first material portion forms a non-particulate structure, and
   the second material portion contacts both the first and second objects.

2. The assembly according to claim 1, comprising: at least two first material portions comprising the intermetallic compounds,
   wherein
   the at least two first material portions contacts both the first and the second objects, and
   the second material portion locates between the two first material portions.

3. The assembly according to claim 2, further comprising: at least two metal walls composed of the second metal and contacting at least one of the first and the second objects,
   wherein each of the at least two first material portions locates between the second material portion and one of the at least two metal walls.

4. The assembly according to claim 3, wherein the at least two metal walls contact both the first and the second objects.

5. The assembly according to claim 1, comprising: one or more first material portions comprising the intermetallic compounds,
   wherein the one or more first material portions contact one of the first and second objects and are covered with the second material portion.

6. The assembly according to claim 5, further comprising: one or more metal pads composed of the second metal and contacting one of the first and second objects,
   wherein each of the one or more metal pads is at least partially covered with one of the one or more first material portions.

7. The assembly according to claim 1, wherein
   the first brazing metal comprises tin, and/or
   the second metal comprises nickel and/or copper, and/or
   the third metal comprises gold.

8. The assembly according to claim 3, wherein the first material portion forms a layer perpendicular to the integral faces of the first and second objects.

9. A method for assembling a first object and a second object, the method comprising:
- (i) making a brazing element formed with at least a first brazing metal and a third metal on one of the first and the second objects, wherein one of the first and the second objects is a substrate and the other is a cap,
- (ii) contacting the brazing element with at least a second metal the melting point of which is higher than that of the first brazing metal,
- (iii) brazing the first object and the second object by isothermally solidifying the brazing element, forming at least one linking element between faces of the first object and the second object so that the first and second objects are integral with each other, and
- (iv) integrating a microsystem with the substrate and encapsulating the microsystem in a cavity formed between the substrate and the cap, wherein said linking element is a sealing bead forming hermetic side walls of the cavity and comprises at least a first material portion comprising intermetallic compounds of a phase formed with the first brazing metal and the second metal, and at least a second material portion composed of the third metal, which is different from the first brazing metal and the second metal, and said second material portion contacts both the first and the second objects.

10. The method according to claim 9, further, comprising:
before said contacting (ii), (v) making at least two metal walls composed of the second metal contacting with at least one of the first and the second objects, wherein:
   during said contacting (ii), the brazing element is provided between the at least two metal walls, and
   said brazing forms at least two first material portions comprising the intermetallic compounds, the at least two first material portions contacting both the first and the second objects, the second material portion being provided between the at least two first material portions, and each of the at least two first material portions being provided between the second material portion and one of the at least two metal walls.

11. The method according to claim 9, further comprising:
before said making (i), (vi) making one or more metal pads composed of the second metal and contacting one of the first and the second objects, wherein the brazing element is made such that the brazing element at least partially covers the one or more metal pads, and said brazing (iii) forms one or more first material portions comprising the intermetallic compounds, the one or more first material portions at least partially covering the one or more metal pads and being covered with the second material portion.

12. The method according to claim 9, further comprising:
before said making (i), (vii) making one or more metal pads composed of the second metal and contacting one of the first and the second objects, wherein the brazing element is made on the other of the first and the second objects,
   during said contacting (ii), the brazing element is provided against the one or more metal pads, and
   said brazing (iii) forms one or more first material portions comprising the intermetallic compounds, the first material portions at least partially covering the one or more metal pads and being covered with the second material portion.

13. The method according to claim 9, wherein said making (i) comprises:
depositing the third metal on one of the first and the second objects,
depositing the first brazing metal on the third metal, and
heat treating the first brazing metal and the third metal, forming through solid state diffusion the brazing element which is composed of an eutectic composed of the first brazing metal and the third metal.

14. The method according to claim 9, wherein the first brazing metal comprises tin and/or the second metal comprises nickel or copper and/or the third metal comprises gold.

* * * * *